(12) United States Patent
Yokoo et al.

(10) Patent No.: US 8,506,231 B2
(45) Date of Patent: Aug. 13, 2013

(54) HANDLER HAVING POSITION CORRECTING FUNCTION AND METHOD OF LOADING UNINSPECTED DEVICE INTO MEASURING SOCKET

(75) Inventors: Masayoshi Yokoo, Yamagata (JP);
Koichi Yoshida, Yamagata (JP);
Norikazu Kainuma, Yamagata (JP)

(73) Assignee: Tohoku Seiki Industries, Ltd., Yamagata-shi (JP)

( * ) Notice: Subject to any disclaimer, the term of this patent is extended or adjusted under 35 U.S.C. 154(b) by 942 days.

(21) Appl. No.: 12/531,546

(22) PCT Filed: Mar. 16, 2007

(86) PCT No.: PCT/JP2007/056120
§ 371 (c)(1),
(2), (4) Date: Sep. 16, 2009

(87) PCT Pub. No.: WO2008/114457
PCT Pub. Date: Sep. 25, 2008

(65) Prior Publication Data
US 2010/0104404 A1 Apr. 29, 2010

(51) Int. Cl.
*B65H 1/16* (2006.01)
*B65H 5/08* (2006.01)
(52) U.S. Cl.
USPC ............ 414/226.01; 414/222.01; 414/222.06; 414/225.01; 901/16; 901/40; 324/512; 324/750.14
(58) Field of Classification Search
USPC ............ 414/222.01, 222.04, 222.05, 222.06, 414/225.01, 226.01; 324/512, 750.14; 901/16, 901/40
See application file for complete search history.

(56) References Cited

U.S. PATENT DOCUMENTS
7,575,408 B2 * 8/2009 Tominaga ................ 414/416.08

FOREIGN PATENT DOCUMENTS
| JP | 5107306 | A | 4/1993 |
| JP | 5107306 | W | 4/1993 |
| JP | 5113466 | A | 5/1993 |
| JP | 5113466 | W | 5/1993 |
| JP | 11344529 | A | 12/1999 |
| JP | 11344529 | W | 12/1999 |
| JP | 2002311087 | A | 10/2002 |
| JP | 2002311087 | W | 10/2002 |
| WO | PCTJP2007056120 | R | 6/2007 |

* cited by examiner

*Primary Examiner* — Scott Lowe
(74) *Attorney, Agent, or Firm* — Millen, White, Zelano, Branigan, P.C.

(57) ABSTRACT

A handler includes a device holding portion, which holds an uninspected device and loads the device in a measuring socket on a device tester, having a suction means for sucking the device by a very weak pushing force at the time of sucking the device from an uninspection tray and for loading the device in a measuring socket and also having a clamper capable of outputting a pushing force which can be changed at the time of the measurement contact. The device holding portion includes a position correcting mechanism for making a device position correction executed by an image recognizing and position correcting means.

8 Claims, 12 Drawing Sheets

Fig.6
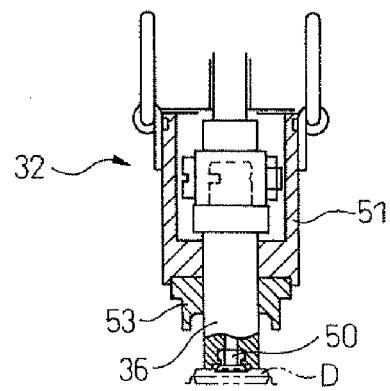
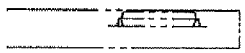
Fig.7
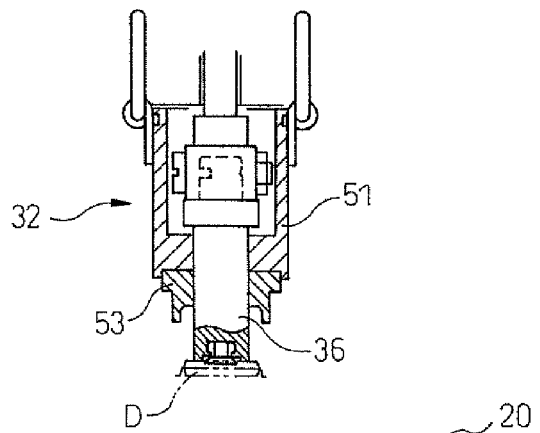
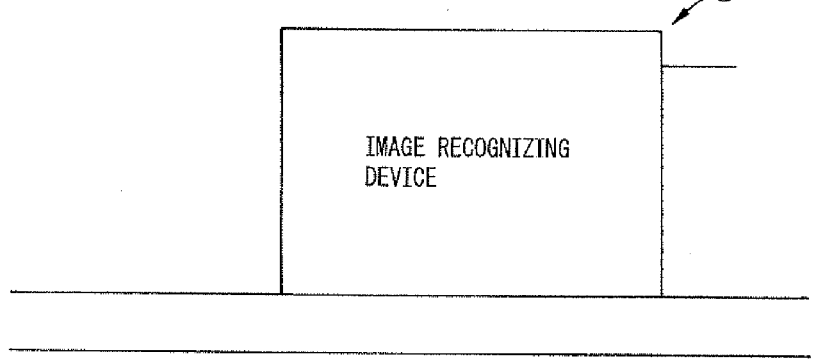

Fig.12
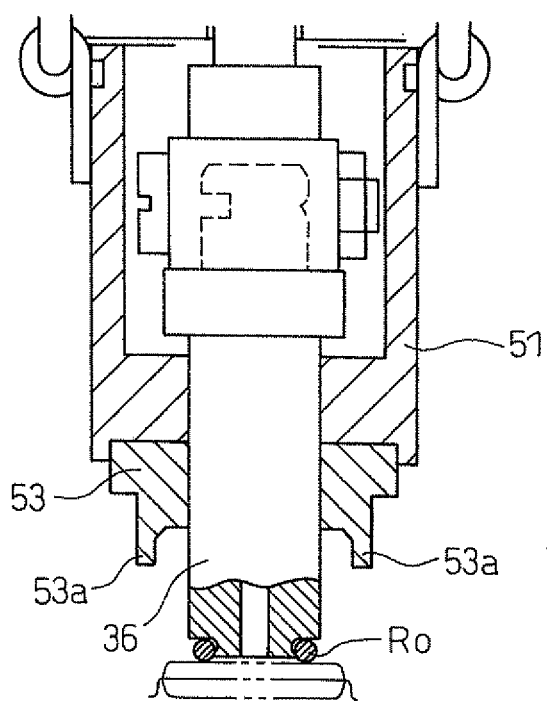
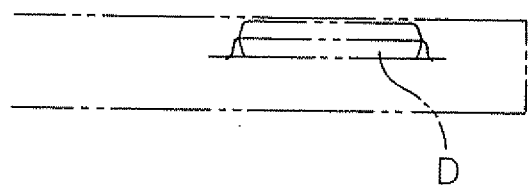

Fig.13
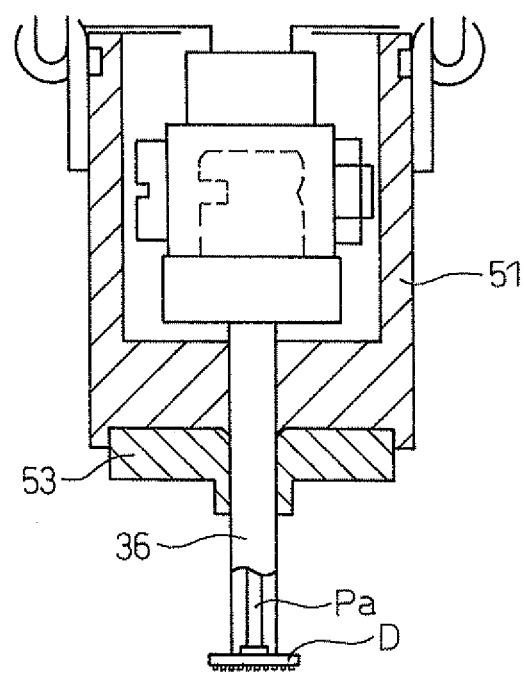
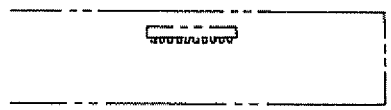

HANDLER HAVING POSITION CORRECTING FUNCTION AND METHOD OF LOADING UNINSPECTED DEVICE INTO MEASURING SOCKET

TECHNICAL FIELD

The present invention relates to a handler used when measuring and inspecting electronic parts, which will be referred to as a device hereinafter, together with an electronic part inspecting device. More particularly, the present invention relates to a horizontal-type handler.

BACKGROUND ART

Recently, electronic equipment has made rapid progress and various devices are mounted on electronic equipment and devices has been downsized. Therefore, the devices can be mounted on electronic equipment at high density. Accordingly, many packages are mounted on a surface of the electronic equipment.

Examples of the devices described above are CSP (Chip Size Package), BGA (Ball Grid Array) and QFP (Quad Flat Package). That is, the devices are made thinner and lighter. Further, the intervals of the pins incorporated into the devices are arranged at short intervals and the number of pins has increased.

Concerning the devices described above, in order for the electronic equipment to exhibit a previously designed operating function, the quality of the devices must be high. Therefore, in the manufacturing process of electronic parts, it is important to provide an electronic part inspection device, which will be referred to as a device tester hereinafter, which judges whether or not the quality of the devices is high at the time of shipment.

In this connection, in order to enhance the efficiency of the inspection made by the above device tester, an automatic handler is provided which holds, conveys and loads a device to be inspected from an accommodation region to a conveyance region.

The above handler in the case of the handler of so-called horizontal model type, operation is executed as follows. A tray accommodating an uninspected device is arranged in a loader portion in the handler. The uninspected device is automatically handled and positioned. When necessary, the uninspected device is heated. An electric test is made for the uninspected device by a test head portion of an adjacent device tester through a measuring socket. According to the result data of the test, the thus tested device is classified into a non-defective item, a defective item or an item to be tested again and automatically accommodated on a tray.

Referring to FIG. 15, the handler, which has been previously proposed by the present applicant, will be explained below.

This handler is a laterally moving-type in which the device positioning table S is linearly moved in the lateral direction. That is, in this handler, the lateral moving plate 3, on which the device D supplied by the supplying hand 2 is set, is moved. The disk 5 in the inspection and conveyance device B is driven by the motor 4. By the suction pad provided on the first stage 6 side loaded on the disk 5, the device D is sucked and raised from the lateral moving plate 3. By the rotation of the disk 5, the device D is faced to an upper portion of the measuring socket T and pushed into the measuring socket T. Then the device D is measured by the measuring device. Information based on the thus obtained measurement values is transmitted to the discharge hand 8 and a direction is given to indicate where the inspected device D is to be discharged.

That is, the characteristic of device D is detected by the measuring device and information of the quality of device D is obtained. According to the information of the quality of the device D, the discharge hand 8 is made to discharge the device D to an objective portion (unloader 9) according to the quality of the device D.

On the other hand, various devices are becoming more and more downsized and made thin and light. Further, pins in the devices are arranged at shorter intervals, and the number of pins has increased. Therefore, uninspected device D must be accurately positioned, pushed and held in the measuring socket, which is to be used for the inspection of device D, by the handler. In order to cope with the above tasks, the Official gazettes of JP-A-9-281165, 10-123207 and 2006-337044 propose a means for measuring and correcting a device terminal position by an image recognizing device and loading the device in a measuring socket.

However, even by the means described above, a series of steps of holding, conveying, loading into a socket, pushing and accommodating can not be accomplished correspondingly to various types of devices.

Especially, when device D to be inspected is loaded into the measuring socket, a method is employed in which device D to be inspected is dropped into the measuring socket from a position very close to the measuring socket or a position right above the measuring socket. When this method is employed, even if positioning is accurately made with great effort, there is a fear that the posture of the device may collapse.

In the system in which the sucking, socket loading nozzle and the measuring clamper are separated from each other and after a robot loads the device into the IC socket, the device is pushed by the measuring clamper which is a different unit, it is difficult to provide sufficiently high processing capacity.

For the reasons described above, the present applicant aimed at the invention of a handler capable of accomplishing the following objects.

(1) In the case where a device is sucked from an uninspection tray located at a rough position and the position is corrected as it is and then the device is loaded in a measuring socket, it is sufficient to use a necessarily minimum pushing force. On the other hand, at the time of making measurements, it is necessary to use a predetermined pushing force (several kg to several tens kg). Therefore, the handler can generate such a pushing force; however, there is no fear that the handler may damage the device.

(2) Corresponding to the high performance of a tester, the device holding portion must be provided with a structure of the mechanism capable of enhancing the processing capacity. For example, the device holding portion must be provided with the constitution in which the function of sucking and the function of clamping are carried out being changed over. Further, the device holding portion must be provided with the constitution in which the device changing time into a plurality of holding portions and into the IC socket can be reduced.

(3) Various types of devices can be handled.

(4) In order to reduce the occurrence of a defective contact of the device with the contact pieces which is caused by foreign objects such as a refuse of solder when the measuring socket contact pieces are downsized so as to reduce the intervals of the pins and increase the number of the pins, it is necessary to make the structure so that tips of the contact pieces and the test pins can be cleaned.

The present invention has been proposed from the above viewpoints. An object of the present invention is to provide a handler including a plurality of device holding portions having an independent device position correcting function capable of coping with the inspection of various types of devices and also including a cleaning function.

DISCLOSURE OF THE INVENTION

The present invention provides a handler. The handler in which a predetermined number of uninspected devices are picked up from an uninspection tray, on which uninspected devices are loaded and then the devices are loaded and inspected in a measuring socket on a device tester and returned after the inspection, comprises a plurality of device holding portions for picking up the predetermined number of uninspected devices, each of the plurality of device holding portions including: a position correcting means for recognizing a posture position of the uninspected device held by each device holding portion and for correcting a position of the uninspected device from the posture position information of the uninspected device; an suction means for loading the uninspected device in a measuring socket on the device tester while the suction means is sucking the uninspected device by a very weak pushing force at the time of sucking the device from the uninspection tray; and a clamper for pushing the uninspected device by a predetermined pushing force after the uninspected device is loaded in the measuring socket.

According to one embodiment of the present invention, the position correcting means includes: an image recognizing device for recognizing and obtaining a posture position of the uninspected device; and a position correcting mechanism for correcting a position of the uninspected device from the posture position information of the uninspected device obtained by the image recognizing device.

According to one embodiment of the present invention, the device holding portion includes: a suction means for sucking a device capable of being replaced for each type of the device to be sucked; a clamper arranged on an outer circumference of the suction means; and a pushing member for pushing the uninspected device to a tip of the clamper by a predetermined pushing force.

According to one embodiment of the present invention, the suction means in the device holding portion sucks the uninspected device from the uninspection tray by a very weak pushing force at the time of sucking the device and the suction means is composed so that it can be elevated by a suction means elevating mechanism for independently elevating the suction means separately from the clamper and for loading the uninspected device in the measuring socket through a buffer means.

According to one embodiment of the present invention, the clamper is held by a clamper holding bracket being capable of moving in the vertical direction independently from the suction means, and a pressure detection means for detecting that the pushing force is a value which has been set for each device is provided in the clamper holding bracket.

According to one embodiment of the present invention, the clamper is held by a clamper holding bracket so that the clamper can be moved in the vertical direction independently from the suction means, and a cylinder is arranged in the clamper holding bracket and a pushing force is controlled for each device by an electropneumatic regulator.

According to one embodiment of the present invention, the handler further comprises: a cleaning means for cleaning a contact piece of the measuring socket; and a visualizing means for visualizing a state of the contact piece.

One embodiment of the present invention provides a method of loading an uninspected device in a measuring socket by a handler, the handler including: a plurality of device holding portions for picking up a predetermined number of uninspected devices from an uninspection tray on which the uninspected devices are loaded, each device holding portion including: a position correcting means for recognizing a posture position of the uninspected device and for correcting a position of the uninspected device from the posture position information of the uninspected device; a suction means for sucking the uninspected device from the uninspection tray by a very weak pushing force at the time of sucking the uninspected device and for loading the uninspected device in a measuring socket; and a clamper for pushing the uninspected device by a predetermined pushing force after the uninspected device has been loaded in the measuring socket, and the method of loading an uninspected device in a measuring socket by a handler comprises the steps of: correcting a position according to the previously obtained device posture position information at the time of loading a lead type uninspected device in the measuring socket on the device tester; loading the uninspected device in the measuring socket by a very weak pushing force at the time of sucking the uninspected device from the uninspection tray under the condition that the uninspected device is sucked; lifting up the device holding portion under the condition that the suction is stopped when the uninspected device is loaded on the measuring socket; correcting a position of the device holding portion at a position where the lead portion of the uninspected device can be pushed; and pushing the uninspected device to the measuring socket by a pushing force corresponding to the device.

Referring to the accompanying drawings, an embodiment of the present invention will be explained as follows.

BRIEF DESCRIPTION OF THE DRAWINGS

FIG. 6 is a schematic illustration explaining a series of processes of the handler of the present invention including a suction process, a position correcting process, a process of lowering the suction means, a process of raising the suction means, a process of conveying a device and a process of accommodating a device.

FIG. 7 is a schematic illustration explaining a series of processes of the handler of the present invention including a suction process, a position correcting process, a process of lowering the suction means, a process of raising the suction means, a process of conveying a device and a process of accommodating a device.

FIG. 12 is a schematic sectional view showing a primary portion of the device holding portion in which the suction means is replaced with an O-ring type suction means correspondingly to the device to be sucked.

FIG. 13 is a schematic sectional view showing a primary portion of the device holding portion in which the suction means and the pushing member are replaced correspondingly to the non-lead device to be sucked.

BEST MODE FOR CARRYING OUT THE INVENTION

Figure 1:
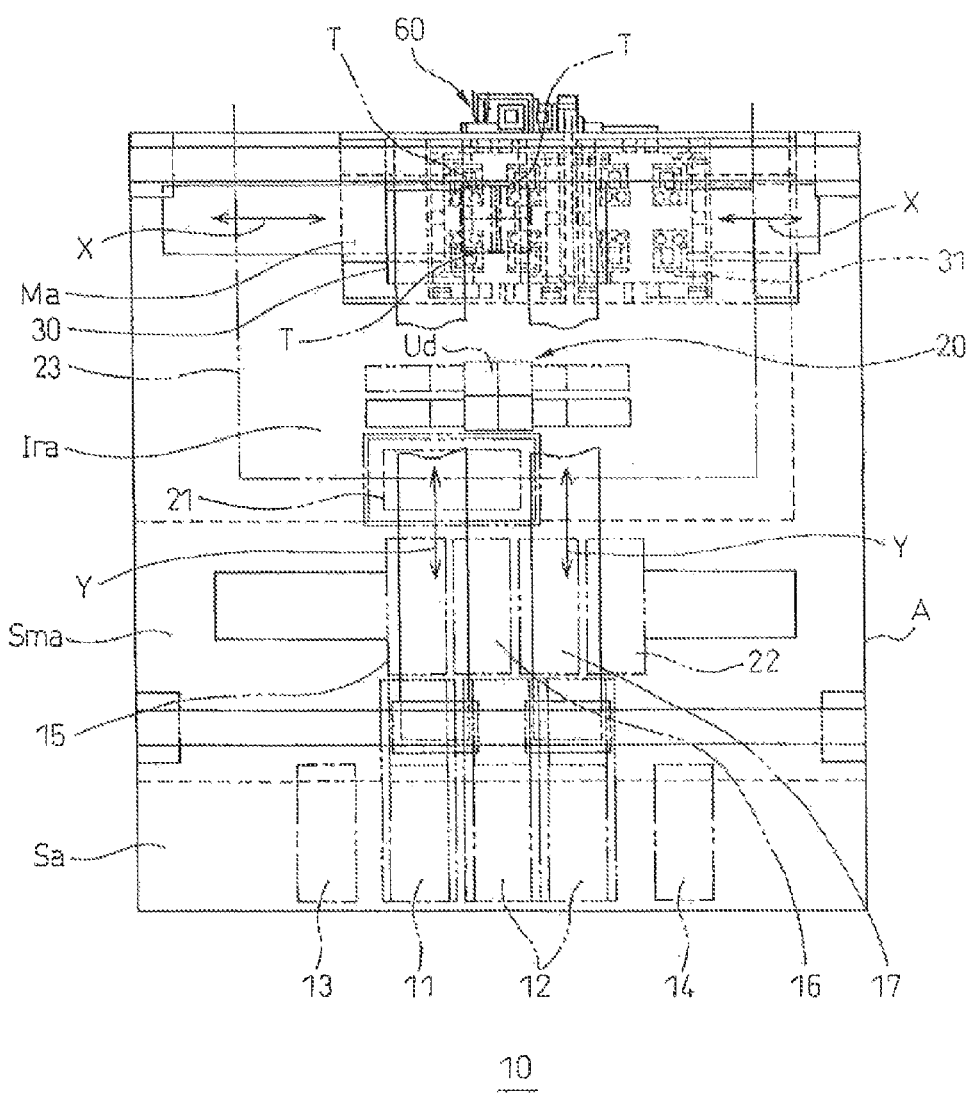
FIG. 1 is a plan view showing an outline of the structure of the handler of the present invention.
Figure 15:
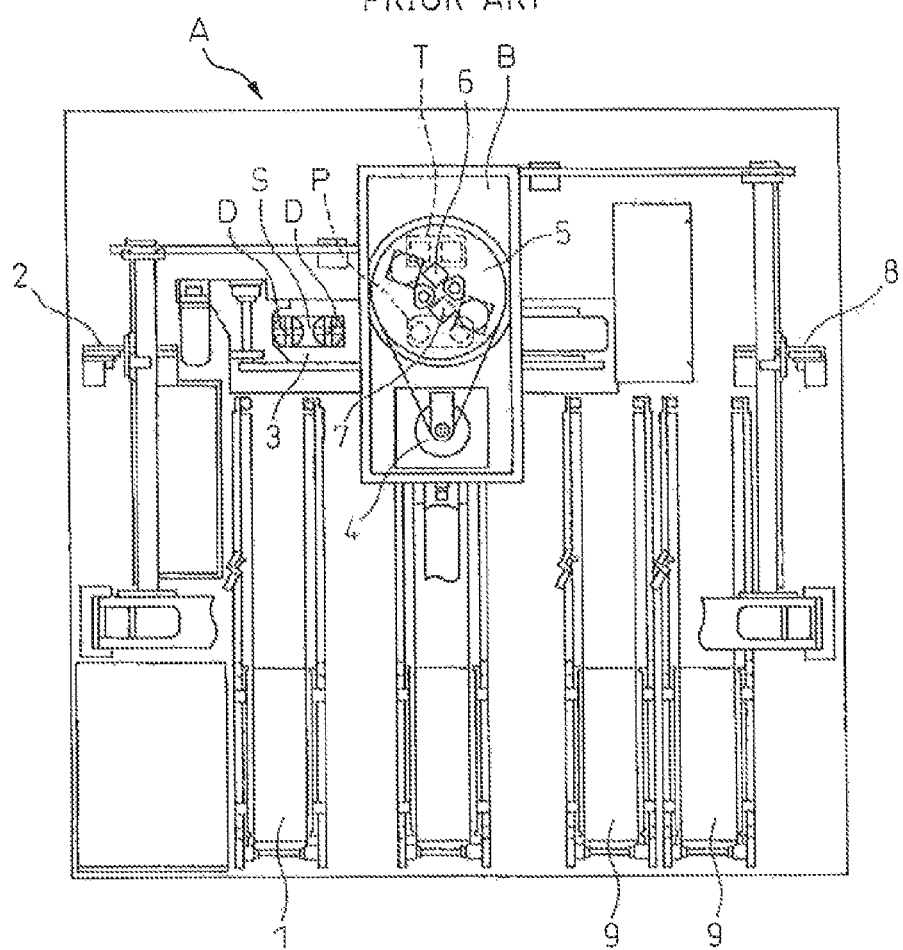
FIG. 15 is a plan view showing an example of the conventional handler.

FIG. 1 is a plan view entirely showing an example of the handler 10 of the present invention. In the same manner as that of the handler shown in FIG. 15, this handler 10 is a horizontal type automatic handler. On the machine casing table A, areas are laid out as follows.

In the drawing, on the machine casing table A, the lowermost stage is a stacker area Sa for the trays. The intermediate stage is a positioning area Sma for positioning each tray. The upper stage portion is an image recognizing area Ira and the uppermost stage portion is a measuring area Ma.

The uninspection tray stacker 11, the accommodation tray stacker 12, 12, the empty tray buffer 13 for an uninspection tray and the empty tray buffer 14 for tray accommodation are arranged in the stacker area Sa in the lowermost stage.

In this connection, although not shown in the drawing, these trays can accommodate and hold a predetermined number of devices. The stacker of each tray can accommodate a tray of 300 mm length.

In the one sheet positioning area Sma in the intermediate stage, a position at which each tray is positioned at predetermined position is shown. A tray can be supplied and discharged by each belt conveyor from each tray stacker to one sheet positioning area Sma. That is, in one sheet positioning area Sma, the uninspection tray one sheet positioning position 15 is ensured at which one sheet uninspection tray, which is conveyed from the uninspection tray stacker 11 in the stacker area Sa by the belt conveyor, is positioned and loaded.

In the one sheet positioning area Sma, the accommodation tray one sheet positioning positions 16, 17 are ensured. When necessary, one sheet placing tray 22 is ensured.

Further, on the lower side of the one sheet positioning area Sma of the uninspection tray and the accommodation tray, the X-direction moving device is provided and greatly moved on the first and the second robot (described later) side, so that an accommodating and sucking pass of the robot can be reduced and the processing capacity can be enhanced.

Next, in the image recognizing area Ira in the upper stage portion, the image recognizing device 20 is arranged. This image recognizing device 20 includes a unit Ud capable of recognizing images of a plurality of devices D (for example, 2 or 4 devices D) at the same time. The distance between the centers is made to be the same as that between the measuring portion measuring socket centers. In this case, in order to positively load the device D to be inspected in the measuring socket described later, a position at which the device D is loaded and a posture of the device D are recognized by an image and adjusted.

In this connection, it is not intended to disclose the image recognizing device 20 in detail by the present invention but the conventional image recognizing device is employed. Therefore, the detailed illustration and explanation of the image recognizing device are omitted here.

When it is necessary to measure high temperatures of the device D, it is possible to arrange a preheat means 21 in the image recognizing area Ira.

Figure 4:
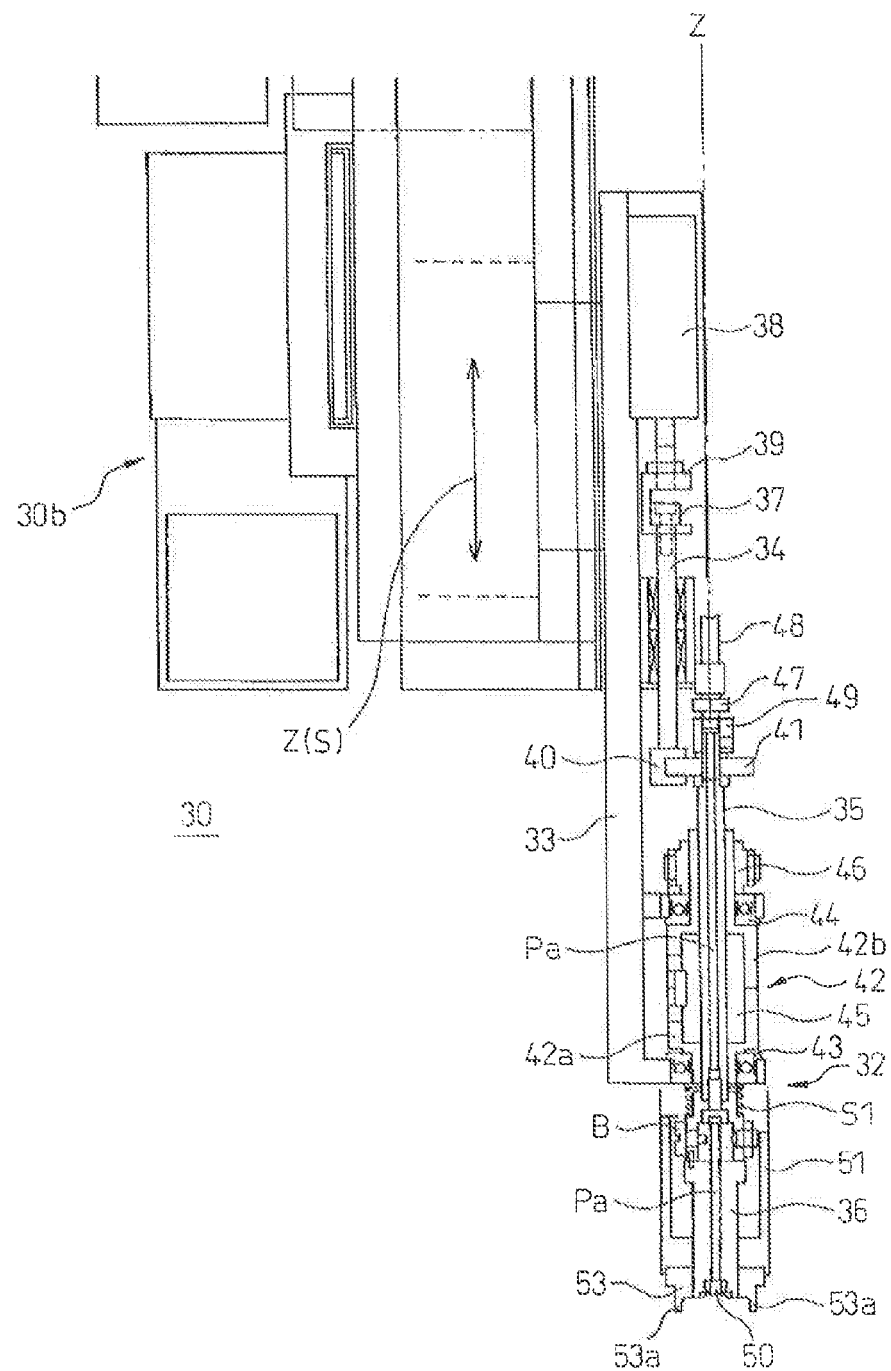
FIG. 4 is an enlarged schematic sectional view showing a primary portion of the device holding portion shown in FIG. 2 in detail.

In the measuring area Ma in the uppermost stage, the measuring sockets T are arranged. In FIG. 4, four measuring sockets T are arranged. The measuring sockets T are electrically connected to the electronic parts tester 23, which will be referred to as a device tester 23 hereinafter, arranged in a lower portion.

In the measuring socket T of the device tester 23 arranged in the measuring area Ma on the machine casing table A, the first and the second robot 30, 31 for loading and discharging the device D to be inspected are arranged.

Figure 2:
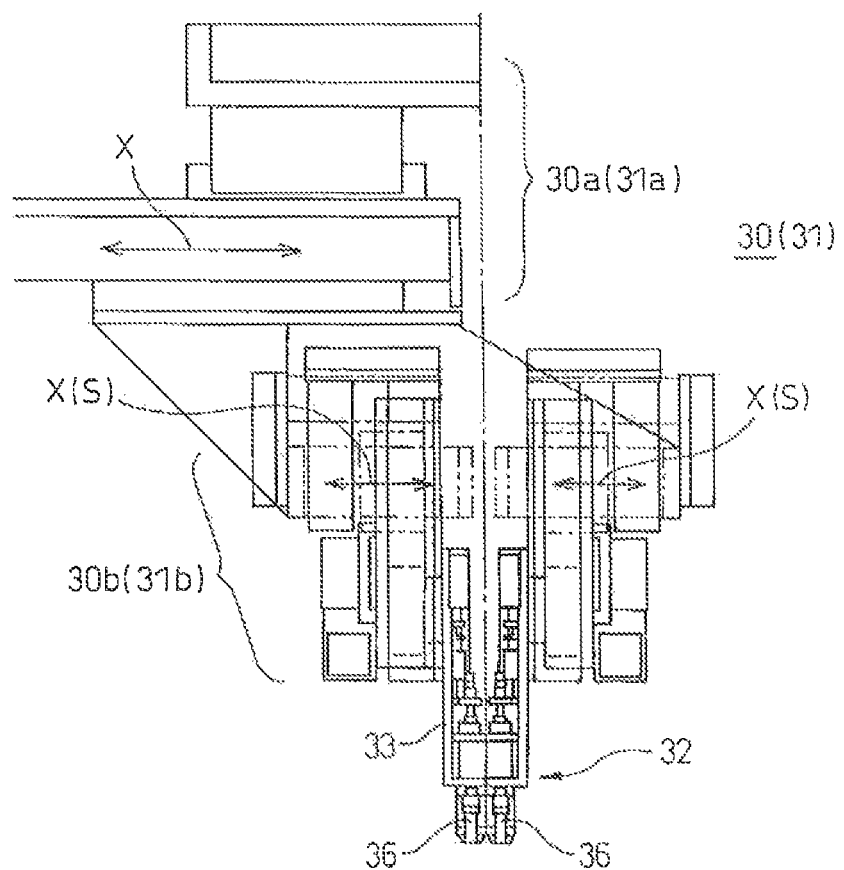
FIG. 2 is one side view of a robot having a device holding portion used for the handler shown in FIG. 1.
Figure 3:
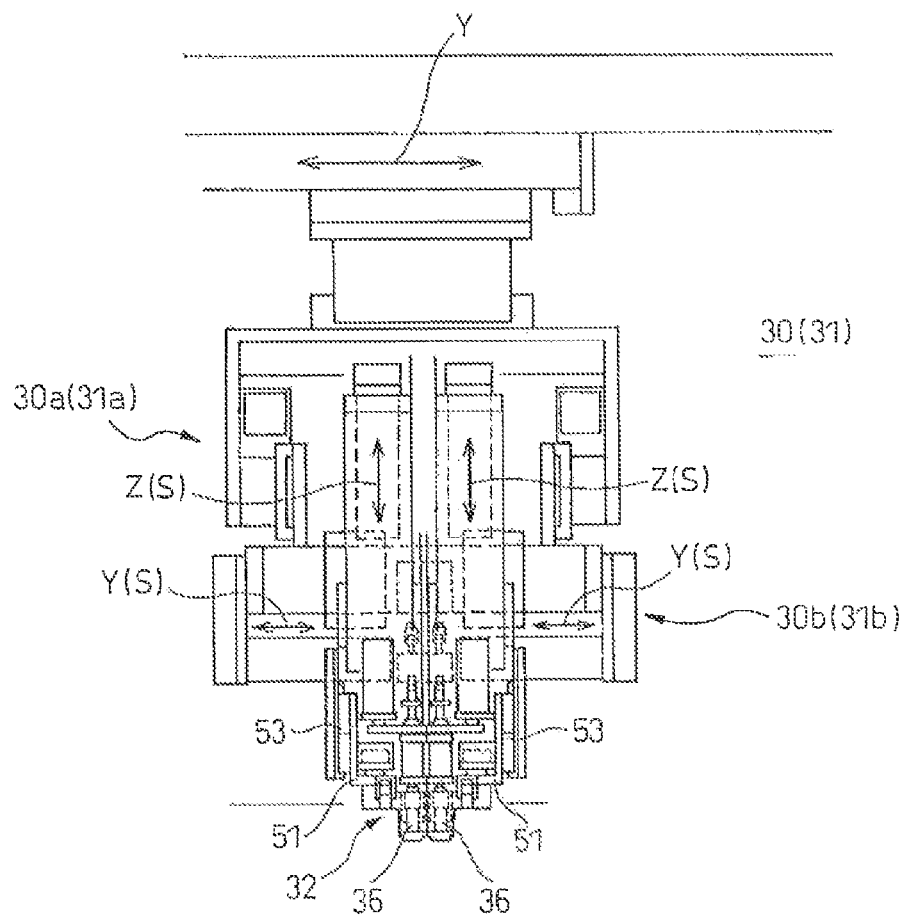
FIG. 3 is another side view of a robot having a device holding portion used for the handler shown in FIG. 1.

The first and the second robot 30, 31 basically include: a movable portion 30a (31a) capable of moving in the two axial direction (X and Y axis); and a position correcting portion 30b (31b) capable of executing a positional correction in the three axial direction S (X, Y and Z axis). Concerning this matter, refer to FIGS. 2 and 3.

That is, the first and the second robot 30, 31 accurately load the uninspected device D, the suction position of which has been recognized by the image recognizing device 20 in the image recognizing area Ira, in the measuring socket T of the device tester 23. At the same time, the first and the second robot 30, 31 push the uninspected device D by a predetermined pushing force.

In this case, the first and the second robot 30, 31 respectively include a device holding portion 32 having a means for picking up the device D and a means for loading the device in the measuring socket T by a predetermined pushing force.

In this connection, a plurality of device holding portions 32 are provided. In the case shown in the drawing, four device holding portions 32 are provided. Each device holding portion 32 picks up an uninspected device D from the uninspection tray which is loaded in the uninspection tray one sheet positioning position 15 in the one sheet positioning area Sma. In order to correct the position of the uninspected device D correspondingly to a distance between the centers of the measuring sockets T, each device holding portion 32 is composed so that the position can be corrected according to the posture position information of the uninspected device which is obtained by the image recognizing device, by the position correcting portion 30b (31b), which is a position correcting mechanism for correcting the device position, and by the rotary drive means (described later) for adjusting a rotation round the axis.

Referring to FIGS. 2 to 5, the device holding portion 32 described above will be explained in detail as follows. Each device holding portion 32 is arranged in the position correcting portion 30b, 31b (the X-axis, the Y-axis, the Z-axis) composing the first and the second robot 30, 31 through the bracket 33. That is, in the bracket 33, the linear shaft 34 is provided which is a suction means elevating mechanism directed in the perpendicular axis direction. On the linear shaft 34, the relay shaft 35 is provided which is hung in the perpendicular direction in parallel with the axial direction of the linear shaft 34. At the forward end of this relay shaft 35, the suction means 36 for sucking the device D is provided so that the suction means 36 can be replaced.

At an upper end of the linear shaft 34, the attachment member 37 is provided. A movement in the vertical direction of the directly driving source 38 is transmitted to the attachment member 37 through the connector 39. In the connector 39, a clearance portion is provided between the connector 39 and the attachment member 37 so that a drive force of the directly driving source 38 can not be directly transmitted to the suction means 36 for sucking the device D.

On the other hand, at a lower end of the linear shaft 34, the recess-shaped joint 40 is provided. At an upper end of the relay shaft 35, the disk 41 engaged with the recess-shaped joint 40 is provided. In this way, a movement of the linear shaft 34 in the vertical direction is transmitted onto the relay shaft 35 side.

Next, on the lower end side of the bracket 33 and the intermediate portion, the relay shaft 35 is supported by the bearings 43, 44 through the upper and lower holders 42a, 42b composing the holder 42. That is, the relay shaft 35 undergoes a spline working on the outer circumference. Therefore the relay shaft 35 gives a rotation and a movement in the vertical direction to the suction means 36 by the ball spline nut 45 held by the holder 42.

In the relay shaft 35, the air suction passage Pa penetrating the relay shaft 35 along the axial center is provided.

In the outer circumferential portion, the ball spline nut 45 is held by the upper and the lower holders 42a, 42b through a key so that it can not be turned. To an upper portion of the upper holder 46, the pulley 46 is fitted. The pulley 46 transmits a rotation of the rotation drive source (described later), which is a position correcting mechanism, through the relay shaft 35 and according to a command given from the image recognizing device 20 and the position correcting means (not shown in the drawing), the device rotary angle is corrected. In this case, when necessary, the rotation drive source has a function of rotating in the case where an angle of the first pin of the device on the tray and an angle of the first pin on the measuring socket are different from each other.

The connector 49 is provided on an upper end side of the relay shaft 35. In the connector 49, the joint 47 for negative pressure used for suction, which is connected to the suction drive source (not shown), and the tube 48 are provided in the connector 49.

Further, on the lower end side of the relay shaft 35, the spring member S1 is arranged which is a buffer means for giving a very weak pushing force to the suction means 36.

The suction means 36 provided in the device holding means 32 can be replaced for each type of the device to be sucked.

In the suction means 36, the air sucking passage Pa is formed along the axial center so that it can be communicated with the air suction passage Pa on the relay shaft 35 side at the time of connecting the suction means 36 with a lower end side of the relay shaft 35 by the bolt B. At a forward end of this suction means 36, the vacuum pad 50, which is a suction means, is fitted. In this connection, the suction means 36 is not limited to the vacuum pad 50 but as the suction means, as described later, the suction means 36 of the O-ring type or the suction means 36 formed out of only a suction hole may be fitted.

Figure 5:
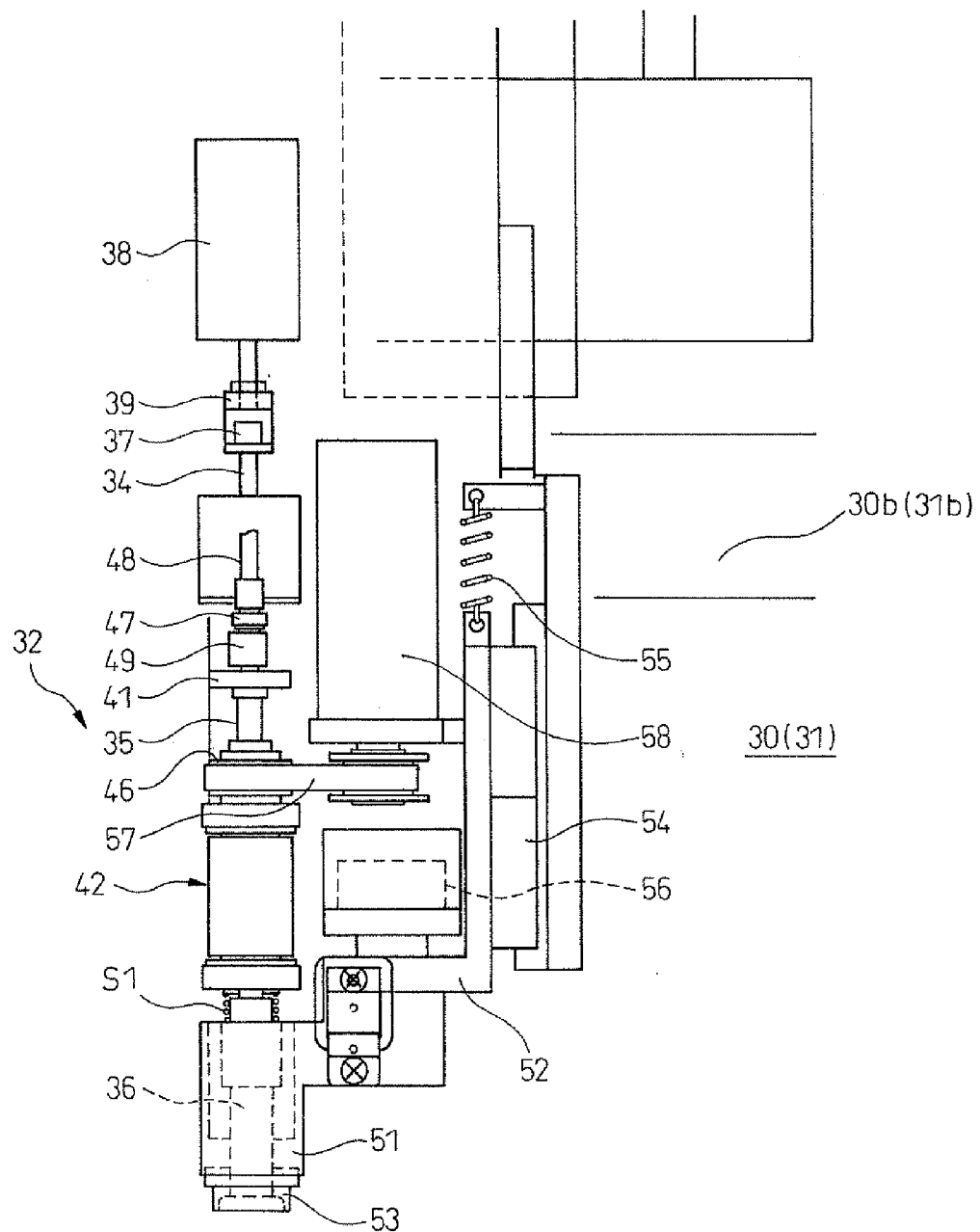
FIG. 5 is an enlarged schematic sectional view showing the device holding portion shown in FIG. 3 in detail.
Figure 8:
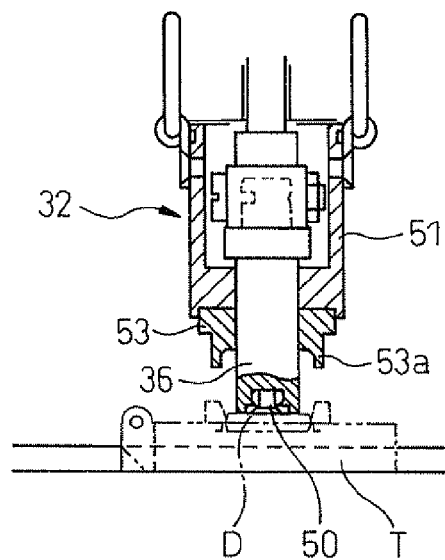
FIG. 8 is a schematic illustration explaining a series of processes of the handler of the present invention including a suction process, a position correcting process, a process of lowering the suction means, a process of raising the suction means, a process of conveying a device and a process of accommodating a device.

On the outer circumference of the suction means 36, the clamper 51 is fixed to the clamper holding bracket 52 as shown in FIG. 5. At a forward end of this clamper 51, the pushing member 53 is fitted. In this case, the pushing member 53 is of the type coping with the lead type device (QFP). That is, the pushing member 53 has a pushing protruding portion 53 coming into contact with the lead which protrudes onto the side portion of the lead type device (QFP). In this connection, concerning the clamper 51, since the device D to be sucked is not only of the lead type device (QFP) but also of the non-lead type device (CSP, BGA), the clamper 51 is held so that it can be replaced so as to fit the pushing member 53.

Onto a side face of the clamper holding bracket 52 for holding the clamper 51, being independent from the Z-axis movable portion bracket 33, the linear guide 54 and others capable of being moved in the vertical direction are fitted and held being capable of expanding and contracting in the vertical direction.

In the clamper holding bracket 52, the pressure detecting means 56 is provided. A load cell, which is capable of detecting that each device is set at a predetermined pressure, is used for the pressure detecting means 56. In this case, a drive source of the pushing force is of the displacement of 30b in the drawing, the vertical direction and the Z-axis.

In this connection, concerning the pressure detecting means 56, the following constitution may be employed. As a drive source of the pushing force, the Z-axis displacement is fixed. Instead of the load cell, a cylinder is arranged. The pushing force is controlled by a widely known electropneumatic regulator.

Further, for correcting a rotary angle, the rotary drive source 58 is arranged, which operates as follows. The rotary drive source 58 gives rotary power for adjusting a rotation through the transmission belt 57 to the pulley 46 on the upper end portion side of the relay shaft 35 connected to the suction means 36.

As described above, in the same device holding portion 32, the suction means 36 is arranged which has a device suction having an independent elevating function and also has a very weak pushing force at the time of loading the device in the measuring socket. Further, in the same device holding portion 32, the clamper 51 is arranged, the pushing force of which can be changed at the time of the measuring contact.

In the present invention, the handler 10 is composed as described above. Next, explanations will be made into a procedure in which the device D is loaded to and discharged from the measuring socket T of the device tester 23 arranged in the measuring area Ma on the machine casing table A of the handler 10.

That is, in the handler 10 of the present invention, not only in the case where the device D is of the non-lead type device (CSP, BGA) but also in the case where the device D is of the lead type device (QFP), the device D can be loaded and inspected in the measuring socket T of the device tester 23.

Referring to FIGS. 6 to 11, a procedure of loading and discharging the lead type device (QFP) will be explained below.

From the stacker area Sa of the handler 10, the uninspection tray holding the device D to be inspected is conveyed by the belt conveyor from the uninspection tray stacker 11 to the one sheet positioning area Sma in the intermediate stage. Then, the uninspection tray holding the device D to be inspected is loaded at the uninspection tray one sheet positioning position 15.

Next, the first robot 30 is started and the movable portion 30a is acted in the two axial direction (X-axis and Y-axis) so that a plurality of device holding portions 32 are made to come close to the uninspection tray and the devices D are sucked by the respective suction means 36 as shown in FIG. 6. In this case, the suction means 36 can sucks the device D to the vacuum pad 50 at the forward end of the suction means 36 as follows. The direct drive source 38 of the device holding portion 32 is driven. Under the condition that the suction means 36 is protruded in the direction of the Z-axis to a position below the clamper 51 and the pushing member 53, the suction means 36 is lowered by the position correcting portion 30b (31b). The vacuum pad 50 at the forward end of the suction means 36 is contacted with the device D. The suction drive source is started. Suction is made through the air sucking passage Pa of the relay shaft 35 and the suction means 36, so that the device D can be sucked to the vacuum pad 50 at the forward end of the suction means 36. In this connection, when the vacuum pad 50 at the forward end of the suction means 36 collides with the device D, the pushing force can be suppressed to a very weak pushing force (not more than several hundreds grams) by the buffer action of the spring member S1 provided between the lower end side of the relay shaft 35 and the suction means 36. Accordingly, there is no fear that the device D may damage.

In the next process, the first robot 30 is operated as follows. Under the condition that the device D is sucked by the suction means 36, a plurality of device holding portions 32 are raised in the direction of the Z-axis by the first robot 30. Next, the device holding portions 32 are moved in the directions of the X-axis and the Y-axis and conveyed to the position of the unit Ud where the image recognizing device 20 recognizes image of a plurality of devices D. Concerning this matter, refer to FIG. 7. At this time, the forward end of the suction means 36, to which the device D is sucked, is protruded downward in the direction of the Z-axis to a position below the clamper 51 and the pushing member 53.

Then, in the image recognizing device 20, by the commands given from the image recognizing device 20 and the position correcting means, a loading position and posture of the device D are recognized by the image, so that the positional information in the directions of X, Y and θ is obtained.

In the next process, the first robot 30 operates the movable portion 30a in the directions of two axes (the X-axis and the Y-axis) and the device holding portion 32, which sucks a plurality of devices D to be inspected, is carried to the measuring socket T of the device tester 23 in the measuring area Ma.

According to the position correcting information of the device in the image recognizing device 20, the first robot 30 drives the position correcting portion 30b so that a distance between the centers of the plurality of device holding portions 32 can be a distance between the centers of the measuring portion sockets T and the positional correction is executed in the directions of X and Y. To the pulley 46 on the upper end side of the relay shaft 35, the rotary drive source 58 gives rotary power, which is used for adjusting a rotation, through the transmitting belt 57, so that the device rotary angle correction can be made.

Due to the foregoing, the plurality of device holding portions 32 can be finely adjusted. Further, the loading position and the posture of the device D can be adjusted so the device D to be inspected can be positively loaded in the measuring socket T.

After the device holding portion 32, which sucks the plurality of devices D to be inspected, has been positioned to the measuring socket T, the position correcting portion 30b is driven. Under the condition that the device D is sucked by the suction means 36, the device D can be loaded in the measuring socket T. Concerning this matter, refer to FIG. 8.

As described above, when the device D is loaded in the measuring socket T, a loading action is executed under the condition that the device D is sucked by the suction means 36. Therefore, being different from the conventional method in which the device D to be inspected is dropped into the measuring socket from a position very close to the measuring socket or a position right above the measuring socket, it is possible to accurately load the device D in the measuring socket T. Accordingly, there is no fear that the posture of the device D may collapse. Therefore, it is possible to contribute to a reduction of the percentage defective.

Figure 9:
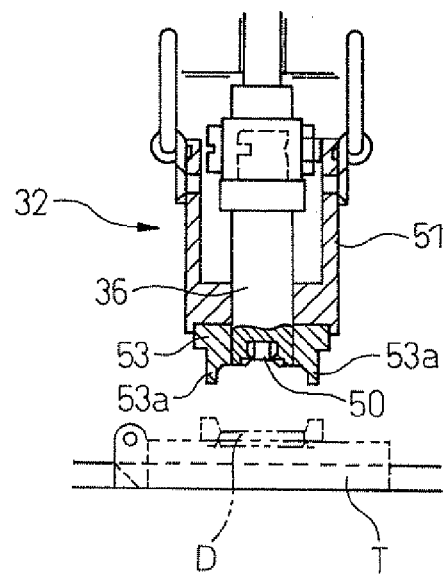
FIG. 9 is a schematic illustration explaining a series of processes of the handler of the present invention including a suction process, a position correcting process, a process of lowering the suction means, a process of raising the suction means, a process of conveying a device and a process of accommodating a device.
Figure 10:
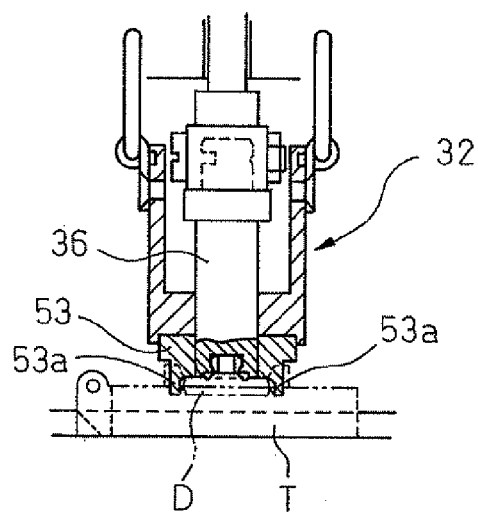
FIG. 10 is a schematic illustration explaining a series of processes of the handler of the present invention including a suction process, a position correcting process, a process of lowering the suction means, a process of raising the suction means, a process of conveying a device and a process of accommodating a device.
Figure 11:
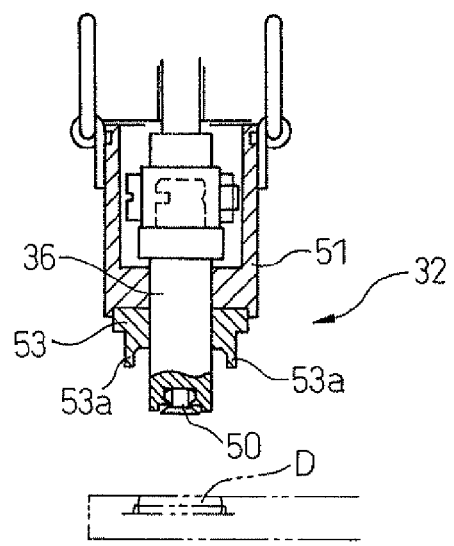
FIG. 11 is a schematic illustration explaining a series of processes of the handler of the present invention including a suction process, a position correcting process, a process of lowering the suction means, a process of raising the suction means, a process of conveying a device and a process of accommodating a device.

Then, under the condition that the suction is stopped by stopping the suction drive source, the direct drive source 38 of the device holding portion 32 is driven and the suction means 36 is raised as shown in FIG. 9. At this time, the device holding portion 32 including the clamper 51 and the pushing member 53 is corrected by the position correcting means to a position at which the clamper 51 and the pushing member 53 can normally push the lead of the device D to the measuring socket T contact piece. By the position correcting portion 30b of the robot 30, the clamper 51 and the pushing member 53 are lowered in the direction of the Z-axis and made to come into contact with the measuring socket T contact piece through the pushing protrusion 53a of the pushing member 53 by a predetermined pushing force (several kg to several tens kg). Concerning this matter, refer to FIG. 10.

In this connection, after the suction means 36 has been raised, the positional correction of the device holding portion 32 including the clamper 51 and the pushing member 53 is executed only for the lead type device (QFP). It is unnecessary to execute the positional correction of the device holding portion 32 for the non-lead type device (CSP, BGA).

After the device D loaded in the measuring socket T of the device tester 23 has been tested and the measurement has been completed, the devices D are sucked by the respective suction means 36. Successively, the suction means 36 is raised up in the direction of the Z-axis and the device holding portion 32 can convey and accommodate the device D, which has been inspected, by the movable portion 30a into the accommodating tray placed at the accommodation tray one sheet positioning position 16, 17 of one sheet positioning area Sma in the intermediate stage. Concerning this matter, refer to FIG. 11.

As described above, in the handler 10 of the present invention, when the device D to be inspected is loaded in the measuring socket T of the device tester 23, under the condition that the sucked device holding portion 32 is positioned and the device D is sucked by the suction means 36, the device D is loaded in the measuring socket T. Accordingly, being different from the conventional method in which the device D to be inspected is dropped into the measuring socket T before loading it in the measuring socket from a position very close to the measuring socket, there is no fear that the posture of the device D may collapse and the measurement defectiveness rates may increase.

As described above, the method of loading and discharging the lead type device (QFP) is explained. However, depending upon a size of the device, the suction means 36 may be replaced. For example, as shown in FIG. 12, it is possible to use the O-ring type suction means 36. In this case, the O-ring Ro made of soft material is provided in the periphery of the forward end of the suction means 36.

On the other hand, in the case where the non-lead type device (CSP, BGA) is loaded into and discharged from the measuring socket T of the device tester 23, as shown in FIG. 13, the suction means 36 and the pushing member 53 are replaced. In this case, the outer diameters of those members must agree with the size of the suction means 36 and the pushing member 53 for pushing the device D into the measuring socket T by a predetermined pushing force has a pushing protrusion 53a protruding along the outer circumference of the suction means 36.

As described above, in the device holding portion 32 of the present invention, the suction means 36 for suction and pushing by a very weak pushing force and the direct drive means 38 are provided together with the clamper 51 for pushing the lead portion of the device D and the pushing member 58 so that these members can be used as a pushing means for exhibiting a necessary pushing force being capable of being replaced. Therefore, it is possible to handle and measure the lead type device and the non-lead type device by the same mechanism.

The handler 10 of the present invention described above can be added with a cleaning means for cleaning a contact piece of the measuring, wherein this cleaning means can be arranged in the device holding portion 32. Further, in order to visualize a state of the contact piece, it is possible to compose a visualizing means.

Figure 14:
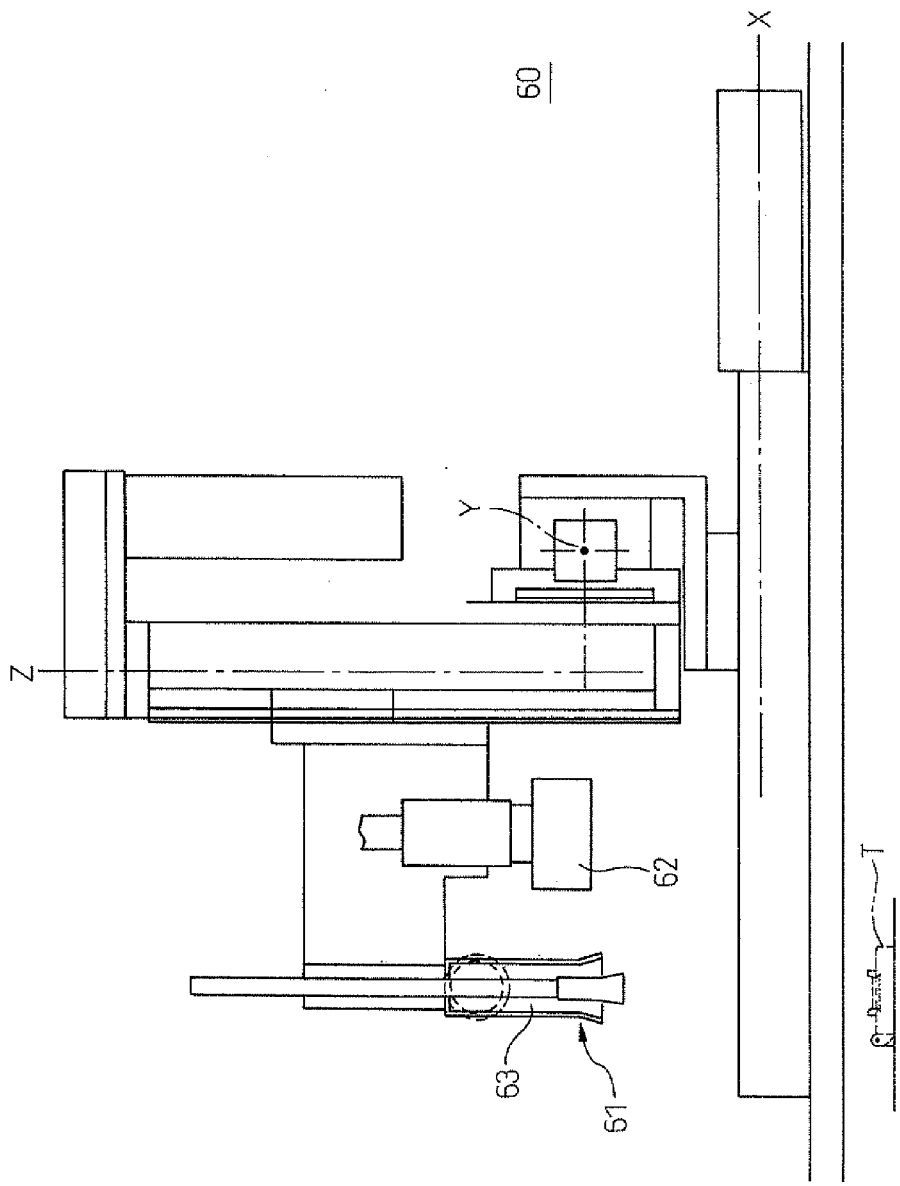
FIG. 14 is a side view showing an outline of the third robot, which is provided in a handler of the present invention, having a cleaning and image recognizing unit used for confirmation.

FIG. 14 shows a third robot 60 having an image recognizing unit for cleaning and confirming which is a cleaning and visualizing means for cleaning and visualizing a forward end portion of the contact piece of the measuring portion measuring socket.

This third robot 60 is different from the first and the second robot 30, 31 described before which are used for holding and conveying the device. The third robot 60 includes: a cleaning means 61 arranged in the neighborhood of the measuring portion measuring socket T; and an image recognizing device 62, wherein the cleaning means 61 and the image recognizing device 62 are controlled in the directions of the X-axis, the Y-axis and the Z-axis.

The cleaning means 61 uses a so-called nano-technology brush for removing foreign objects such as refuse of solder attached to a forward end portion of the contact piece of the measuring portion measuring socket T. The nozzle 63 is coaxially fitted to the cleaning means 61. This nozzle 63 blows off the foreign objects, which have been removed, by a blow of clean air (not shown). After that, the foreign objects are caught by vacuum (not shown) in the clean room.

The image recognizing device 62 is used when an operator judges whether or not foreign objects, which are attached to the forward end portion of the contact piece of the measuring portion measuring socket T, have been removed. That is, for example, a monitor (not shown) provided on the operator side displays a contact piece of the measuring portion measuring socket T and the operator confirms by visual inspection whether or not the foreign objects have been removed. In the case where the foreign objects are remaining, a command of retrying the cleaning unit is given and the cleaning means 61 and the drive source of the removing nozzle are operated again.

Further, the image recognizing device 62 described above has a function of confirming a position of the measuring portion measuring socket T at the time of replacing the measuring portion measuring socket T or changing the measuring portion measuring socket T at the time of changing the type of the device.

When this function is put into practical use, by the frequency of the measuring contacts, the deterioration of the percentage defective, which is caused by the defective contact of the device D with the contact piece caused when foreign objects such as refuse of IC solder are existing, can be prevented by the cleaning operation of the forward end portion of the contact piece and by visualizing it. Accordingly, the working time of the tester can be ensured to be as long as possible.

According to the present invention, the following advantages can be provided.

(1) A method of processing is employed in which a plurality of device holding portions are fitted to the conveyance robot for conveying a device from the device suction position on the uninspection tray to the measuring portion measuring socket position and the accommodating position on the accommodation tray through the image recognizing position. Therefore, the processing capacity is enhanced.

(2) Irrespective of the type of a device, the device can be sucked and normally pushed to the measuring socket contact portion by a predetermined pushing force so that the measurement can be made.

(3) In order to prevent the occurrence of defective contact of the device with the contact piece caused by foreign objects such as refuse of solder, the contact piece and the forward end of the test pin can be cleaned. Due to the foregoing, the working ratio of the expensive tester can be enhanced.

EXPLANATION OF LETTERS OR NUMERALS

10 . . . handler
11 . . . uninspection tray stacker
12 . . . accommodation tray stacker
13 . . . empty tray buffer for an uninspection tray
14 . . . empty tray buffer for tray accommodation
15 . . . uninspection tray one sheet positioning position
16, 17 . . . accommodation tray one sheet positioning position
18 . . . empty uninspection tray position
19 . . . empty accommodation tray position
20 . . . image recognizing device
21 . . . preheat means
22 . . . one sheet placing tray
23 . . . device tester
30 . . . first robot
31 . . . second robot
30a, 31a . . . movable portion
30b, 31b . . . position correcting portion
32 . . . device holding portion
33 . . . bracket
34 . . . linear shaft
35 . . . relay shaft
36 . . . suction means
37 . . . attachment member
38 . . . directly driving source
39 . . . connector
40 . . . recess-shaped joint
41 . . . disk
42 . . . holder
42a . . . upper holder
42b . . . lower holder
43, 44 . . . bearing
45 . . . ball spline nut
46 . . . pulley
47 . . . joint for negative pressure used fur suction
48 . . . tube
49 . . . connector
50 . . . vacuum pad
51 . . . clamper
52 . . . clamper holding bracket
53 . . . pushing member
53a . . . pushing protrusion
54 . . . linear guide 55 ... spring
56 ... pressure detecting means
57 ... transmitting belt
58 ... rotary drive source
60 ... third robot
61 ... cleaning means
62 ... image recognizing means
63 ... nozzle

The invention claimed is:

1. A handler for picking up a predetermined number of devices from an uninspection tray, on which the devices are loaded, loading the devices for inspection in measuring sockets on a device tester, and returning the devices after the inspection, the handler comprising:
   a plurality of device holding portions, each device holding portion capable of picking up a device from the uninspection tray; and
   position correcting means for correcting a position of each device holding portion relative to a corresponding measuring socket, based on a posture/position information of the device held on the device holding portion;
   each device holding portion including:
      suction means for sucking the device; and
      a pushing member separated from the suction means and capable of pushing the device loaded on the measuring socket by a predetermined pushing force,
   the position correcting means including:
      a position correcting mechanism operable for each device holding portion, the position correcting mechanism capable of correcting a position of the suction means relative to the measuring socket on which no device is loaded, based on the posture/position information, and also capable of correcting a position of both of the pushing member and the suction means relative to the device loaded on the measuring socket.

2. The handler of claim 1, wherein the position correcting means includes an image recognizing device capable of recognizing and obtaining the posture/position information; and wherein the position correcting mechanism corrects the position of the suction means based on the posture/position information obtained by the image recognizing device.

3. The handler of claim 1, wherein each device holding portion is configured so that the suction means and the pushing member are respectively replaceable depending on a type of the device to be sucked.

4. The handler of claim 1, wherein each device holding portion further includes a suction means elevating mechanism capable of elevating the suction means independently of the pushing member, and a buffer means capable of buffering a pushing force applied by the suction means to the device at a level lower than the pushing force applied by the pushing member to the device.

5. The handler of claim 1, wherein each device holding portion further includes a clamper to which the pushing member is fitted, a clamper holding bracket to which the clamper is fixed so as to be capable of moving in a vertical direction independently from the suction means, and a pressure detection means provided on the clamper holding bracket and capable of detecting that the pushing force is a value which has been set for each device.

6. The handler of claim 1, wherein each device holding portion further includes a clamper to which the pushing member is fitted, a clamper holding bracket to which the clamper is fixed so as to be capable of moving in a vertical direction independently from the suction means, and a cylinder arranged in the clamper holding bracket and capable of controlling the pushing force for each device through an electropneumatic regulator.

7. The handler of claim 1, further comprising:
   a cleaning means for cleaning a contact piece of the measuring socket; and
   a visualizing means for visualizing a state of the contact piece.

8. A method of loading a lead-type uninspected device on a measuring socket by using the handler of claim 1, comprising:
   correcting, by the position correcting mechanism, a position of the suction means sucking the lead-type uninspected device relative to the measuring socket on which no device is loaded, based on the posture/position information;
   loading, on the measuring socket, the lead-type uninspected device sucked by the suction means located at the position corrected by the position correcting mechanism;
   lifting up the suction means while stopping a sucking operation of the suction means in a condition that the lead-type uninspected device is loaded on the measuring socket;
   correcting, by the position correcting mechanism, a position of both of the pushing member and the suction means relative to the lead-type uninspected device loaded on the measuring socket, so as to enable the pushing member to push a lead portion of the lead-type uninspected device; and
   pushing the lead portion of the lead-type uninspected device to the measuring socket by the pushing force of the pushing member located at the position corrected by the position correcting mechanism.

* * * * *